United States Patent
Li et al.

(10) Patent No.: US 10,998,890 B2
(45) Date of Patent: May 4, 2021

(54) RADIATION-HARDENED D FLIP-FLOP CIRCUIT

(71) Applicants: Bin Li, Chantilly, VA (US); David Bostedo, Fairfax, VA (US); Landon J. Caley, Fredricksburg, VA (US); Nicholas J. Chiolino, Fayetteville, AR (US); Patrick Fleming, Redondo Beach, CA (US); David D. Moser, Haymarket, VA (US)

(72) Inventors: Bin Li, Chantilly, VA (US); David Bostedo, Fairfax, VA (US); Landon J. Caley, Fredricksburg, VA (US); Nicholas J. Chiolino, Fayetteville, AR (US); Patrick Fleming, Redondo Beach, CA (US); David D. Moser, Haymarket, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 394 days.

(21) Appl. No.: 16/076,530

(22) PCT Filed: Dec. 29, 2017

(86) PCT No.: PCT/US2017/069105
§ 371 (c)(1),
(2) Date: Aug. 8, 2018

(87) PCT Pub. No.: WO2019/133001
PCT Pub. Date: Jul. 4, 2019

(65) Prior Publication Data
US 2019/0363699 A1    Nov. 28, 2019

(51) Int. Cl.
H03K 3/3562   (2006.01)
H03K 19/003   (2006.01)
H03K 3/356    (2006.01)

(52) U.S. Cl.
CPC ..... H03K 3/35625 (2013.01); H03K 19/0033 (2013.01); H03K 3/356069 (2013.01)

(58) Field of Classification Search
CPC ......... H03K 3/35625; H03K 3/356069; H03K 19/0033
See application file for complete search history.

(56) References Cited

U.S. PATENT DOCUMENTS

| 6,058,041 A | 5/2000 | Golke et al. |
| 6,392,474 B1 | 5/2002 | Li et al. |

(Continued)

OTHER PUBLICATIONS

International Search Report, PCT/US2017/069105, dated Mar. 9, 2018, 7 pages.

Primary Examiner — Sibin Chen
(74) Attorney, Agent, or Firm — Antony P. Ng; Russell Ng PLLC; Scott J. Asmus

(57) ABSTRACT

A flip-flop circuit is disclosed. The flip-flop circuit includes a single-input inverter, a dual-input inverter, a single-input tri-state inverter, a dual-input tri-state inverter, and two single-event transient (SET) filters. The single-input tri-state inverter receives an input signal D. The dual-input tri-state inverter includes a first input, a second input and an output, wherein the first input receives output signals from the dual-input inverter and the second input receives output signals from the dual-input inverter via the first SET filter. The output of the dual-input tri-state inverter sends output signals to a first input of the dual-input inverter and a second input of the dual-input inverter via the second SET filter. The single-input inverter receives inputs from the dual-input inverter to provide an output signal Q for the flip-flop circuit.

13 Claims, 5 Drawing Sheets

(56) References Cited

U.S. PATENT DOCUMENTS

| | | |
|---|---|---|
| 7,212,056 B1 | 5/2007 | Belov |
| 2006/0267653 A1 | 11/2006 | Fulkerson |
| 2008/0115023 A1* | 5/2008 | Carlson ............ H03K 19/00338 |
| | | 714/731 |
| 2009/0189634 A1 | 7/2009 | Rezgui et al. |

* cited by examiner

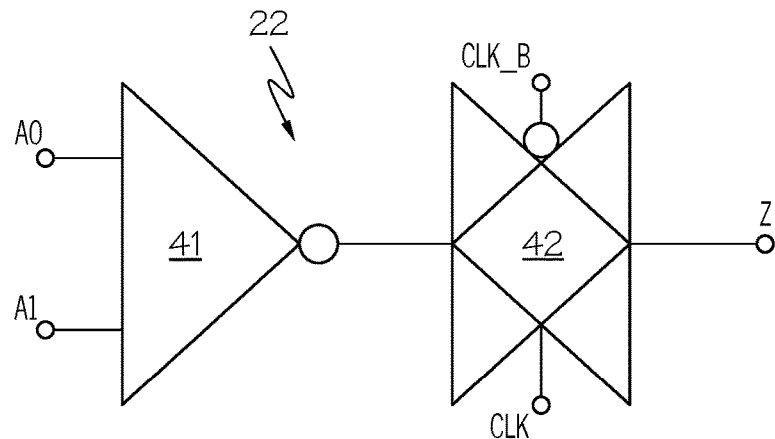
FIG. 4A
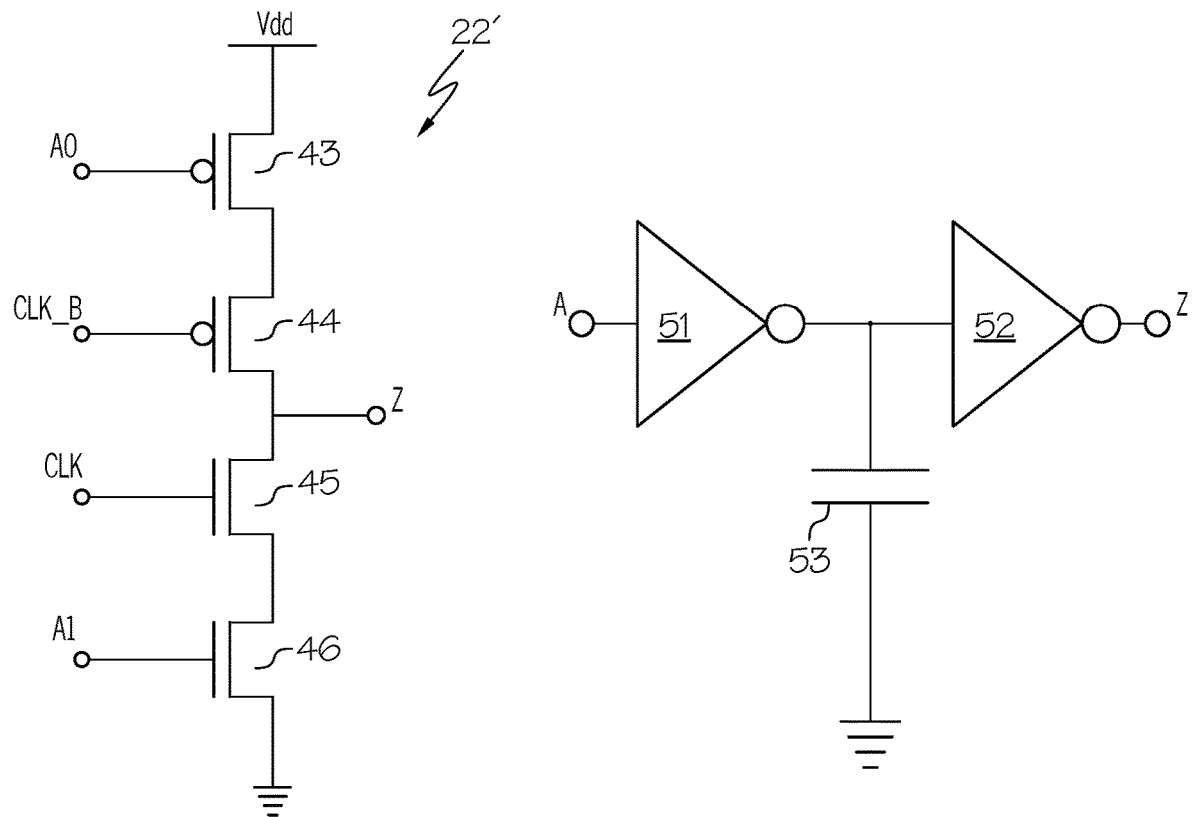
FIG. 4B
FIG. 5

RADIATION-HARDENED D FLIP-FLOP CIRCUIT

TECHNICAL FIELD

The present disclosure relates to electronic circuits in general, and in particular to flip-flop circuits. Still more particularly, the present disclosure relates to a radiation-hardened D flip-flop circuit.

BACKGROUND

A digital logic system typically includes combinational circuits and sequential circuits. Combinational circuits are formed of logic gates, the outputs of which are decided by current inputs. Combinational circuits perform operations that are logically characterized by Boolean expressions.

Sequential circuits include logic gates as well as storage elements known as flip-flops and latches. The outputs of storage elements are a function of current inputs and the states of the storage elements based on the previous inputs. Thus, the outputs of sequential circuits are the result of the current inputs as well as the previous inputs, and the operations of sequential circuits are decided by the internal states and a time sequence of inputs.

Many integrated circuit devices having digital logic circuits are vulnerable to single-event upsets due to radiation, and conventional flip-flop circuits and latches are no exceptions. Additional measures can be added to conventional flip-flop circuits and latches to make them more immune to single-event upsets, but a huge amount of extra circuits and space are needed for the purpose of providing sensitive nodes separation. A huge amount of extra circuits, however, is not preferable for implementations on aircraft and/or spacecraft, and definitely not acceptable at small technology nodes because it will lead to circuits that consume more power while taking much more silicon areas at the same time.

The present disclosure provides an improved radiation-hardened D flip-flop circuit.

SUMMARY

In accordance with one embodiment of the present disclosure, a latch includes a single-input inverter, a dual-input inverter, a single-input tri-state inverter, a dual-input tri-state inverter, and two single-event transient (SET) filters. The single-input tri-state inverter receives an input signal D. The dual-input tri-state inverter includes a first input, a second input and an output, wherein the first input receives output signals from the dual-input inverter and the second input receives output signals from the dual-input inverter via the first SET filter. The output of the dual-input tri-state inverter sends output signals to a first input of the dual-input inverter and a second input of the dual-input inverter via the second SET filter. The single-input inverter receives inputs from the dual-input inverter to provide an output signal Q for the D flip-flop circuit.

The features and advantages described herein are not all-inclusive and, in particular, many additional features and advantages will be apparent to one of ordinary skill in the art in view of the drawings, specification and claims. Moreover, it should be noted that the language used in the specification has been selected principally for readability and instructional purposes and not to limit the scope of the inventive subject matter.

BRIEF DESCRIPTION OF THE DRAWINGS

The invention itself, as well as its modes of use, further objects, and advantages thereof, will best be understood by reference to the following detailed description of an illustrative embodiment when read in conjunction with the accompanying drawings.

FIG. 4A is a schematic diagram of a dual input tri-state inverter within the D flip-flop and latch circuits from FIGS. 2A-2B, in accordance with a first embodiment;

FIG. 4B is a schematic diagram of a dual input tri-state inverter within the D flip-flop and latch circuits from FIGS. 2A-2B, in accordance with a second embodiment; and FIG. 5 is a schematic diagram of a single-event transient (SET) filter within the D flip-flop circuit from FIGS. 2A-2B, in accordance with one embodiment.

DETAILED DESCRIPTION

Figure 1:
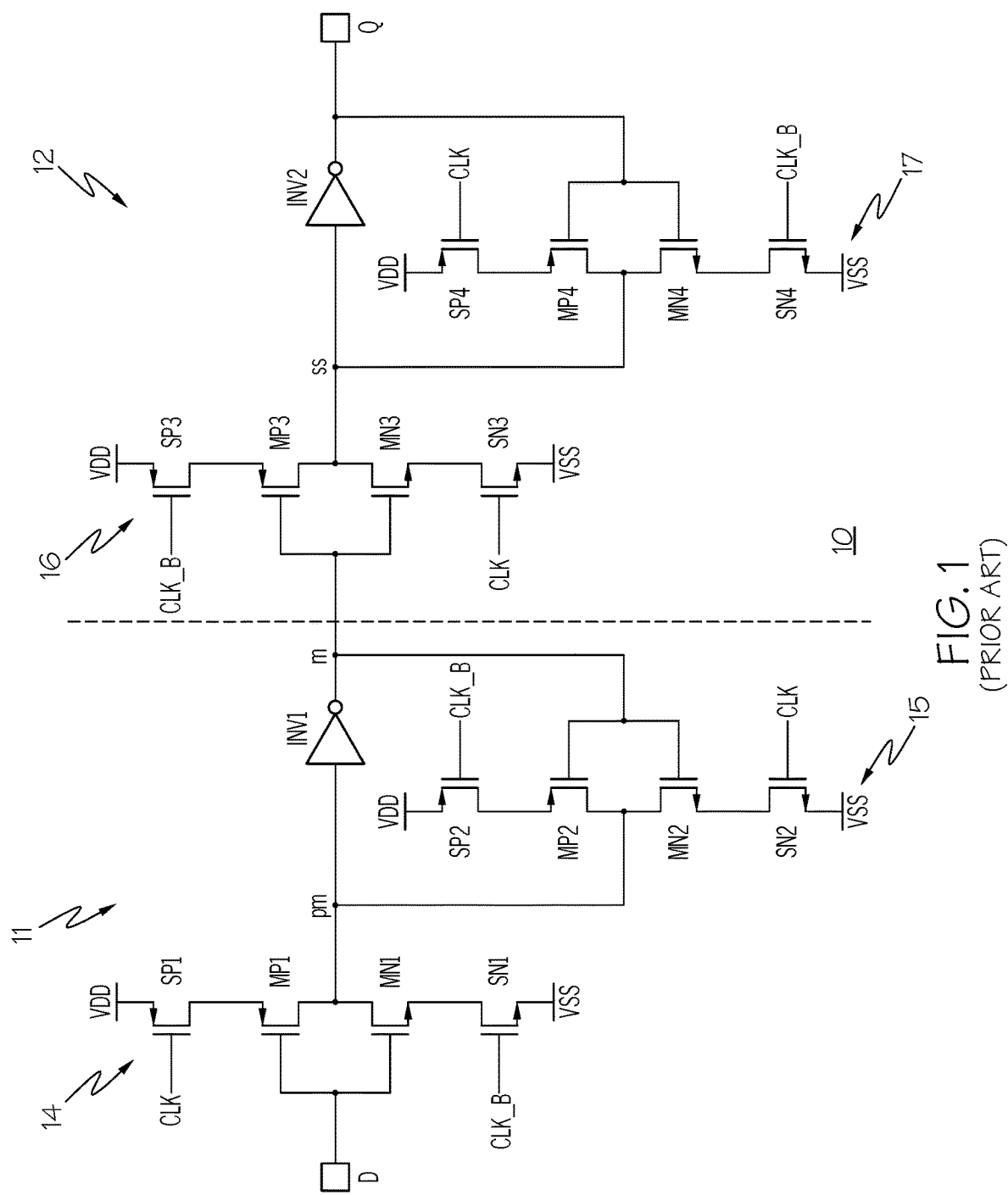
FIG. 1 is a schematic diagram of a D flip-flop circuit, according to the prior art.

Referring now to the drawings and in particular to FIG. 1, there is illustrated a schematic diagram of a D flip-flop (DFF) circuit, according to the prior art. As shown, a DFF circuit 10 includes a master latch 11 and a slave latch 12. Master latch 11 includes first and second clocked inverter stages 14-15 and a first (unclocked) inverter INV1. First clocked inverter stage 14 includes a p-channel clock switch SP1, a p-channel data device MP1, an n-channel data device MN1, and an n-channel clock switch SN1, all connected in series. Second clocked inverter stage 15 includes a p-channel clock switch SP2, a p-channel data device MP2, an n-channel data device MN2, and an n-channel clock switch SN2, all connected in series. Similarly, slave latch 12 includes third and fourth clocked inverter stages 16-17, having analogously configured clock switches SP3, SN3, SP4, and SN4 as well as data devices MP3, MN3, MP4, and MN4, along with a second (unclocked) inverter INV2.

In-phase clock signals CLK and opposite-phase clock signals CLK_B, which are generated by a clock source (not shown), can be fed to DFF circuit 10. When clock signal CLK is low and clock signal CLK_B is high, inverter stage 14 is turned on, and data output pm of inverter stage 14 will be the opposite of its data input D. Similarly, inverter stage 17 is turned on, and the data output ss of inverter stage 17 will be the opposite of its data input Q. When clock signal CLK is high and clock signal CLK_B is low, inverter stages 14 and 17 will be turned off. On the other hand, when clock signal CLK is high and clock signal CLK_B is low, inverter stage 15 is turned on, and data output pm of inverter stage 15 will be the opposite of its data input m. Similarly, inverter stage 16 is turned on, and data output ss of inverter stage 16 will be the opposite of its data input m. When clock signal CLK is low and clock signal CLK_B is high, inverter stages 15 and 16 will be turned off.

During a first phase of a system clock signal, master latch 11 receives and latches an input signal D and, during the next phase of the system clock signal, slave latch 12 receives an output signal m from master latch 11 and presents an output signal Q, while master latch 11 receives and latches the next value of input signal D. The data output signals of inverter stages 14, 15 appear at node pm. The data input signal of inverter stages 15, 16 is provided by the data output signal of first inverter INV1 at node m, which is the output of master latch 11 and the input of slave latch 12. The data output signals of inverter stages 16 and 17 appear at node ss. The data input signal of inverter stage 17 is provided by the data output signal of second inverter INV2 at node Q, which is at the output of slave latch 12 and the output of DFF circuit 10.

Figure 2A:
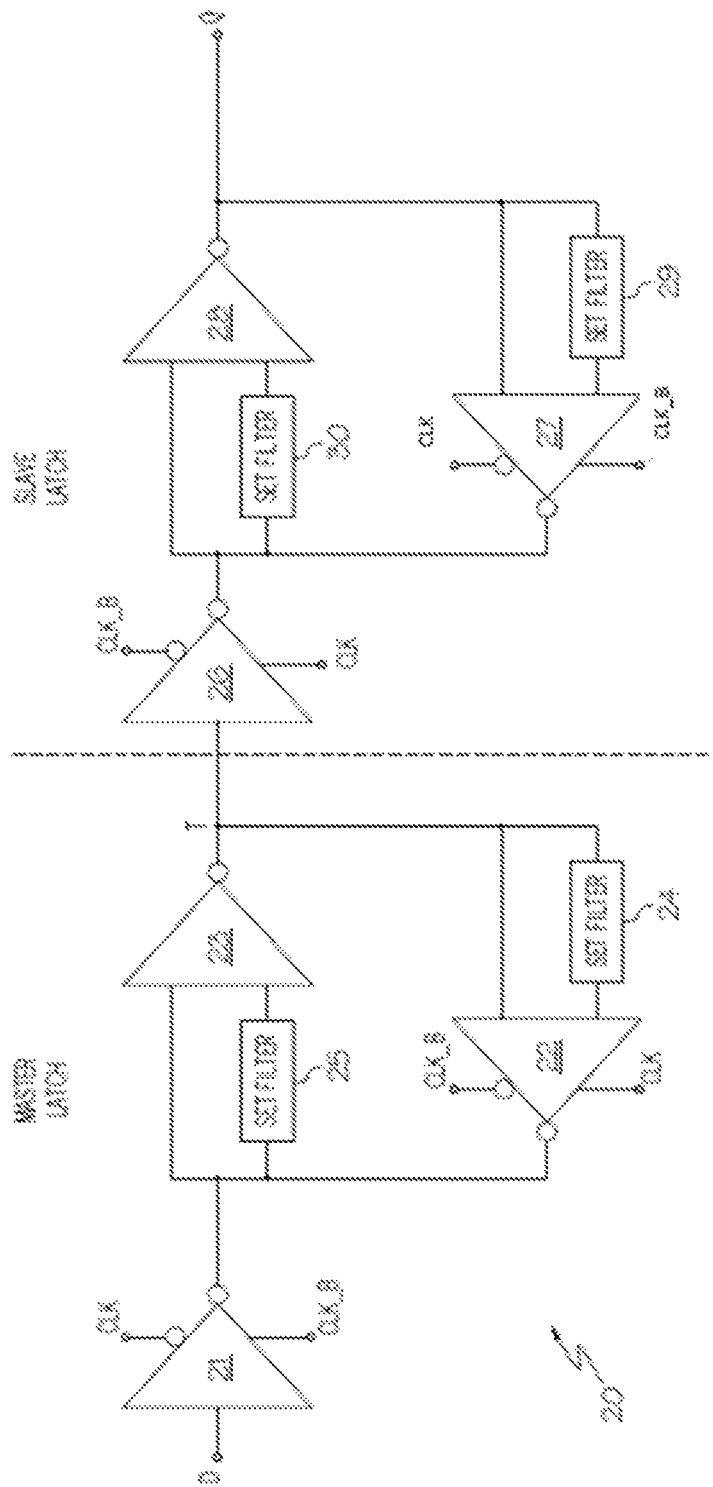
FIG. 2A is a block diagram of a radiation-hardened D flip-flop circuit, in accordance with a first embodiment.

With reference now to FIG. 2A, there is illustrated a schematic diagram of a radiation-hardened DFF circuit, in accordance with a first embodiment. As shown, a radiation-hardened DFF circuit 20 includes a master latch and a slave latch. The master latch includes a single-input tri-state inverter 21, a dual-input tri-state inverter 22, a dual-input inverter 23 and two single-event transient (SET) filters 24-25. The slave latch includes a single-input tri-state inverter 26, a dual-input tri-state inverter 27, a dual-input inverter 28 and two SET filters 29-30. For the master latch, the outputs of tri-state inverters 21, 22 are connected to a first input of dual-input inverter 23 and a second input of dual-input inverter 23 via SET filter 25. The output of dual-input inverter 23 is connected to a first input of dual-input tri-state inverter 22 and a second input of dual-input tri-state inverter 22 via SET filter 24. The output of dual-input inverter 23 is also connected to single-input tri-state inverter 26. For the slave latch, the outputs of tri-state inverters 26, 27 are connected to a first input of dual-input inverter 28 and a second input of dual-input inverter 28 via SET filter 30. The output of dual-input inverter 28 is connected to a first input of dual-input tri-state inverter 27 and a second input of dual-input tri-state inverter 27 via SET filter 29. Radiation-hardened DFF circuit 20 receives an input D at single-input tri-state inverter 21 and provides an output T at dual-input inverter 23 along with an output Q at dual-input inverter 28.

At the master latch side, when clock signal CLK goes to a logical low, data at input D enters single-input tri-state inverter 21. The output of single-input tri-state inverter 21 is split into two paths, one of them directly enters a first input of dual-input inverter 23 while the other one enters a second input of dual-input inverter 23 via SET filter 25. Dual-input inverter 23 and SET filter 25 forms a temporal filter. The output of dual-input inverter 23 only changes state when signals at both inputs of dual-input inverter 23 are the same. Thus, certain width of glitches from input D will be filtered out, depending on the settings of SET filter 25. The output of dual-input inverter 23 goes to single-input tri-state inverter 26 and to output T; and at the same time, it also goes to another temporal filter formed by dual-input tri state inverter 22 and set filter 24. Temporal filters 24, 25 hold the data when clock signal CLK goes to a logical high.

At the slave latch side, when clock signal CLK_B goes to a logical low, output T from dual-input inverter 23 enters single-input tri-state inverter 26. The output of single-input tri-state inverter 26 is split into two paths, one of them directly enters a first input of dual-input inverter 28 while the other one enters a second input of dual-input inverter 28 via SET filter 30. Dual-input inverter 28 and SET filter 30 forms a temporal filter. The output of dual-input inverter 28 only changes state when signals at both inputs of dual-input inverter 28 are the same. The output of dual-input inverter 28 goes to output Q, and at the same time, it also goes to another temporal filter formed by dual-input tri-state inverter 27 and SET filter 29. Temporal filters 29, 30 hold the data when clock signal CLK_B goes to a logical high.

Figure 2B:
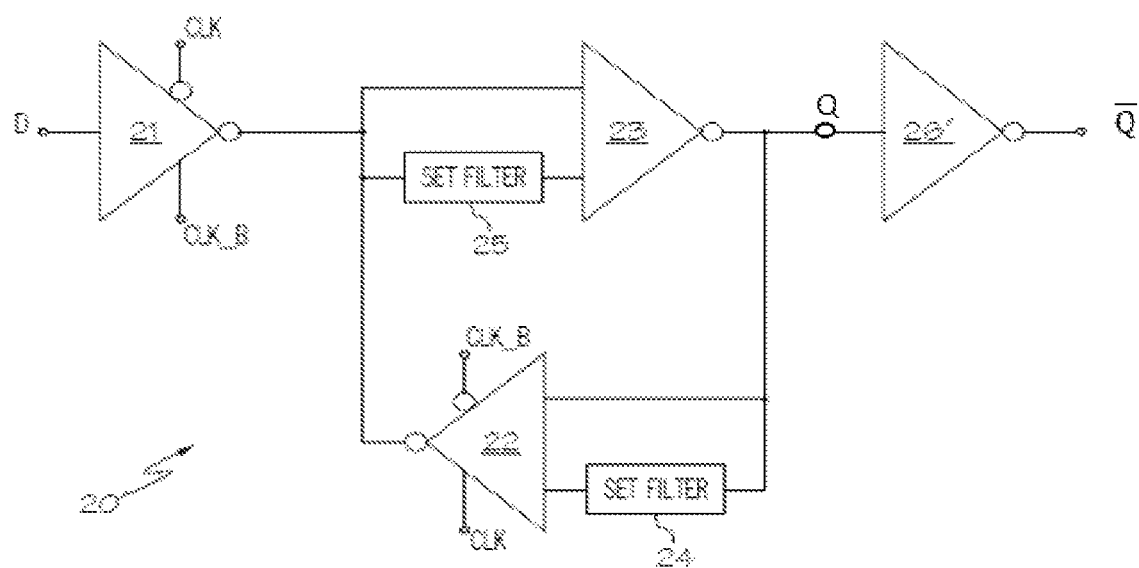
FIG. 2B is a block diagram of a radiation-hardened latch circuit, in accordance with a second embodiment.

The master latch of radiation-hardened DFF circuit 20 in FIG. 2A can be utilized separately without the slave latch. With reference now to FIG. 2B, there is illustrated a schematic diagram of a radiation-hardened latch circuit, in accordance with a second embodiment. As shown, a radiation-hardened latch circuit 20' includes single-input tri-state inverter 21, dual-input tri-state inverter 22, dual-input inverter 23, SET filters 24-25 and single-input inverter 26'. The outputs of tri-state inverters 21, 22 are connected to a first input of dual-input inverter 23 and a second input of dual-input inverter 23 via SET filter 25. The output of dual-input inverter 23 is connected to a first input of dual-input tri-state inverter 22 and a second input of dual-input tri-state inverter 22 via SET filter 24. The output of dual-input inverter 23 is also connected to single-input inverter 26. Radiation-hardened latch circuit 20' receives input D at single-input tri-state inverter 21 and provides output $\overline{Q}$ at single-input inverter 26'.

When clock signal CLK goes to a logical low, data at input D enters single-input tri-state inverter 21. The output of dual-input tri-state inverter 21 is split into two paths, one of them directly enters a first input of dual-input inverter 23 while the other one enters a second input of dual-input inverter 23 via SET filter 25. Dual-input inverter 23 and SET filter 25 forms a temporal filter. The output of dual-input inverter 23 only changes state when signals at both inputs of dual-input inverter 23 are the same. The output of dual-input inverter 23 goes to single-input inverter 26' and to output $\overline{Q}$ and at the same time, it also goes to another temporal filter that is formed by dual-input tri-state inverter 22 and SET filter 24. Temporal filters 24, 25 hold the data when clock signal CLK goes to a logical high.

Figure 3A:
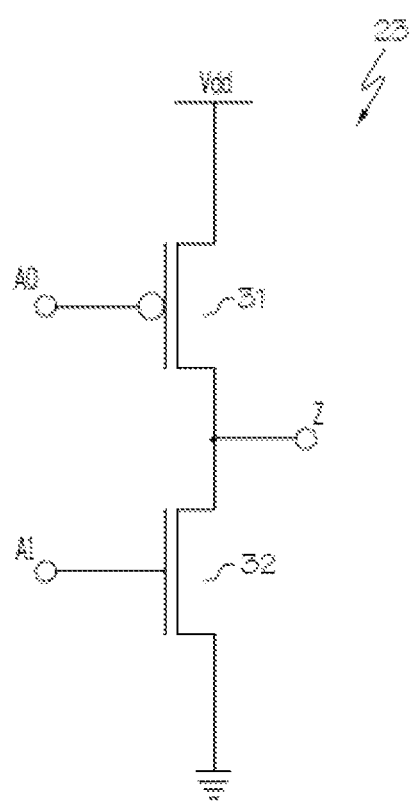
FIG. 3A is a schematic diagram of a dual-input inverter within the D flip-flop and latch circuits from FIGS. 2A-2B, in accordance with a first embodiment.

Dual-input inverters 23 and 28 are substantially identical from each other, so only dual-input inverter 23 will be further described in details. Referring now to FIG. 3A, there is depicted a schematic diagram of dual-input inverter 23, in accordance with a first embodiment. As shown, dual-input inverter 23 includes a p-channel transistor 31 and an n-channel transistor 32 connected in series between Vdd and ground. After receiving an input A0 at p-channel transistor 31 and an input A1 at n-channel transistor 32, dual-input inverter 23 provides an output Z.

Figure 3B:
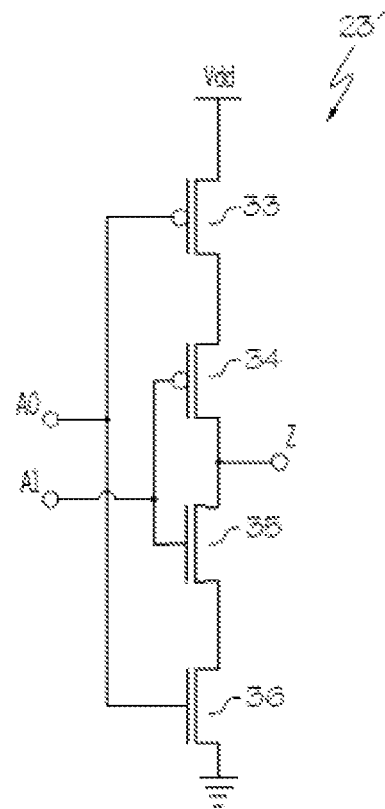
FIG. 3B is a schematic diagram of a dual-input inverter within the D flip-flop and latch circuits from FIGS. 2A-2B, in accordance with a second embodiment.

Referring now to FIG. 3B, there is depicted a schematic diagram of dual-input inverter 23, in accordance with a second embodiment. As shown, dual-input inverter 23' includes p-channel transistors 33, 34 and n-channel transistors 35, 36 connected in series between Vdd and ground. After receiving input signal A0 at p-channel transistor 31 and n-channel transistor 36, and input signal A1 at p-channel transistor 34 and n-channel transistor 35, dual-input inverter 23' provides output signal Z. Dual-input inverter 23' can be used as a dual-input tri-stable inverter as well.

Dual-input tri-state inverters 22 and 27 are substantially identical from each other, so only dual-input tri-state inverter 22 will be further described in details. With reference now to FIG. 4A, there is illustrated a schematic diagram of dual-input tri-state inverter 22 from FIGS. 2A, 2B, in accordance with a first embodiment. As shown, dual-input tri-state inverter 22 includes a dual-input inverter 41 connected to a transmission gate 42. Transmission gate 42 is clocked by in-phase clock signals CLK and opposite phase clock signals CLK_B. After receiving input signals A0, A1 at dual-input inverter 41, dual-input tri-state inverter 22 provides an output signal Z when CLK is at a logical high.

With reference now to FIG. 4B, there is illustrated a schematic diagram of dual-input tri-state inverter 22 from FIGS. 2A, 2B, in accordance with a second embodiment. As shown, dual-input tri-state inverter 22' includes p-channel transistors 43, 44 and n-channel transistors 45, 46 connected in series between Vdd and ground. N-channel transistor 45 is clocked by in-phase clock signals CLK, p-channel transistor 44 is clocked by opposite phase clock signals CLK_B. After receiving input signal A0 at p-channel transistor 43 and input signal A1 at p-channel transistor 46, tri-state inverter 22' provides output signal Z when CLK is at a logical high.

SET filters 24-25 and 29-30 are substantially identical from each other, so only SET filter 24 will be further described in details. Referring now to FIG. 5, there is depicted a schematic diagram of SET filter 24 within DFF circuit 20 from FIG. 2A and latch circuit 20' from FIG. 2B, in accordance with one embodiment. As shown, SET filter 24 includes single-input inverters 51, 52 connected in series and a capacitor 53 connected the node between single-input inverters 51 and 52 to ground. According to one embodiment, in order to meet certain reliability requirements, the delays of single-input inverters 51, 52 should not have an edge longer than approximately 240 ps. After receiving signal at input A at single-input inverter 51, SET filter 24 provides a signal at output Z. With capacitor 53, the signal from input A to output Z is delayed. The delay time of SET filters 24-25 and 29-30 should be chosen to be the glitch of SET.

As has been described, the present disclosure provides an improved radiation-hardened DFF circuit. The DFF circuit includes four temporal filters, transistors that are optimally sized, and a layout requirement to couple logically contrary transistors while separating logically consistent transistors. The temporal filter formed by a SET filter and a dual-path inverter will reject any SET glitch that is equal to or less than the delay time of the SET filter, mainly because the output of the dual-path inverter does not change the state unless both inputs are the same. The SET filtering on internal latch and demonstrated multiple-node charge cancellation technique can increase radiation hardening without using redundant circuits and separation space that requires a significantly large amount of silicon area. The improved DFF circuit minimizes the area penalty while providing enough radiation hardness to meet error rate targets.

While the invention has been particularly shown and described with reference to a preferred embodiment, it will be understood by those skilled in the art that various changes in form and detail may be made therein without departing from the spirit and scope of the invention.

What is claimed is:

1. A flip-flop circuit comprising:
   a first single-input tri-state inverter for receiving an input D;
   a first dual-input inverter;
   a first and second single-event transient (SET) filters;
   a first dual-input tri-state inverter includes a first input for receiving output signals from said first dual-input inverter, a second input for receiving output signals from said first dual-input inverter via said first SET filter, and an output for sending output signals to a first input of said first dual-input inverter and to a second input of said first dual-input inverter via said second SET filter;
   a second single-input tri-state inverter for receiving output from said first dual-input inverter;
   a second dual-input inverter;
   a third and fourth SET filters; and
   a second dual-input tri-state inverter includes a first input for receiving output signals from said second dual-input inverter, a second input for receiving output signals from said second dual-input inverter via said third SET filter, and an output for sending output signals to a first input of said second dual-input inverter and to a second input of said second dual-input inverter via said fourth SET filter, wherein said second dual-input inverter provides an output Q for said flip-flop circuit.

2. The flip-flop circuit of claim 1, wherein said first dual-input inverter includes a p-channel transistor and an n-channel transistor connected in series between power and ground.

3. The flip-flop circuit of claim 1, wherein said first dual-input inverter includes two p-channel transistor and two n-channel transistors connected in series between power and ground.

4. The flip-flop circuit of claim 1, wherein said second dual-input inverter includes a p-channel transistor and an n-channel transistor connected in series between power and ground.

5. The flip-flop circuit of claim 1, wherein said second dual-input inverter includes two p-channel transistor and two n-channel transistors connected in series between power and ground.

6. The flip-flop circuit of claim 1, wherein said first dual-input tri-state inverter includes a dual-input inverter and a transmission gate.

7. The flip-flop circuit of claim 1, wherein said first dual-input tri-state inverter includes two p-channel transistors and two n-channel transistors connected in series between power and ground.

8. The flip-flop circuit of claim 1, wherein said second dual-input tri-state inverter includes a dual-input inverter and a transmission gate.

9. The flip-flop circuit of claim 1, wherein said second dual-input tri-state inverter includes two p-channel transistors and two n-channel transistors connected in series between power and ground.

10. The flip-flop circuit of claim 1, wherein said first SET filter includes two inverters connected in series and a capacitor connected between said two inverters.

11. The flip-flop circuit of claim 10, wherein said second SET filter includes two inverters connected in series and a capacitor connected between said two inverters.

12. The flip-flop circuit of claim 11, wherein said third SET filter includes two inverters connected in series and a capacitor connected between said two inverters.

13. The flip-flop circuit of claim 12, wherein said fourth SET filter includes two inverters connected in series and a capacitor connected between said two inverters.

* * * * *